United States Patent [19]

Takeda et al.

[11] Patent Number: 4,796,077
[45] Date of Patent: Jan. 3, 1989

[54] ELECTRICAL INSULATING, SINTERED ALUMINUM NITRIDE BODY HAVING A HIGH THERMAL CONDUCTIVITY AND PROCESS FOR PREPARING THE SAME

[75] Inventors: Yukio Takeda; Satoru Ogihara, both of Hitachi, Japan

[73] Assignee: Hitachi, Ltd., Tokyo, Japan

[21] Appl. No.: 84,073

[22] Filed: Aug. 11, 1987

[30] Foreign Application Priority Data

Aug. 13, 1986 [JP] Japan .................. 61-188479

[51] Int. Cl.$^4$ ............ H01L 23/48; H01L 29/62; C04B 35/52; F27B 9/10
[52] U.S. Cl. .................................. 357/67; 357/80; 357/81; 357/74; 501/88; 501/89; 501/90; 264/65
[58] Field of Search .............. 501/88, 81, 90; 264/65; 357/80, 81, 74, 67

[56] References Cited

U.S. PATENT DOCUMENTS

| | | | |
|---|---|---|---|
| 4,517,584 | 5/1985 | Matsushita et al. | 357/80 |
| 4,569,922 | 2/1986 | Suzuki | 501/89 |
| 4,571,610 | 2/1986 | Matsushita et al. | 357/67 |
| 4,651,192 | 3/1987 | Matsushita et al. | 357/80 |
| 4,687,657 | 8/1987 | Clark et al. | 501/89 |
| 4,698,663 | 10/1987 | Sugimoto et al. | 357/80 |

FOREIGN PATENT DOCUMENTS

| | | | |
|---|---|---|---|
| 2591 | 1/1982 | Japan . | |
| 91059 | 5/1983 | Japan . | |
| 69474 | 4/1984 | Japan . | |
| 27653 | 2/1985 | Japan | 501/89 |

OTHER PUBLICATIONS

Bentsen et al., "Effect of Hot-Pressing Temperature of the Thermal Diffusivity/Conductivity of SiC/Aln Composites", Communications of the American Ceramic Society, Mar. 1983, pp. C-40 to C-41.

Primary Examiner—Eugene R. LaRoche
Assistant Examiner—Michael Shingleton
Attorney, Agent, or Firm—Antonelli, Terry & Wands

[57] ABSTRACT

The present invention provides a highly thermal conductive, electrical insulating ceramic body having at least 90% of theoretical density and comprising 20 to 40% by weight of silicon carbide, the balance being substantially aluminum nitride, the silicon carbide containing not more than 0.1 by weight of sum total of boron, aluminum and nitrogen and not more than 0.2% by weight of sum total of iron, titanium, vanadium, chromium and nickel, and the aluminum nitride containing not more than 1% by weight of oxygen and not more than 0.5% by weight of sum total of silicon, iron and magnesium, the sintered body having a thermal conductivity at 20° C. of at least 250 W/m.°K, an electrical resistivity at 20° C. of at least $10^{10}$ Ω. cm, a dielectric strength at 20° C. of at least 20 kV/cm, a dielectric constant at 1 MHz of not more than 10, a bending strength at 20° C. of at least 400 MPa and a fracture toughness at 20° C. of at least 5MN/m$^{3/2}$. The present sintered body can be used as a substrate for a semi-conductor device, and a semi-conductor device using the present sintered body has good heat radiation.

The present sintered body can be used as a substrate for a semi-conductor device, and a semi-conductor device using the present sintered body has a good heat radiation characteristic.

11 Claims, 3 Drawing Sheets

ELECTRICAL INSULATING, SINTERED ALUMINUM NITRIDE BODY HAVING A HIGH THERMAL CONDUCTIVITY AND PROCESS FOR PREPARING THE SAME

BACKGROUND OF THE INVENTION

(1) Field of the Invention

This invention relates to a process for preparing a sintered body comprising AlN and containing SiC, and more particularly to an electrical insulating sintered AlN body having a high thermal conductivity suitable for mounting Si or GaAs semiconductor devices and a process for preparing the same.

(2) Description of the Prior Art

Recently, circuit-constituting devices such as semiconductor chips, etc. have been mounted on semi-conductor substrates for use in large-scale integrated circuits, etc. with a very high density. On the other hand, needs for large capacity and smaller scale have been more and more increased, and the quality of heat generated per unit area during the working of a semi-conductor device becomes considerably larger. Thus, substrate materials having a better heat radiation, a better electrical insulation and a higher dielectric strength have been in a keen demand. Specifically, materials having a better heat radiation and also a better electrical insulation have been desired for power semi-conductor substrates, power module hybrid substrates, semi-conductor package substrates, semi-conductor laser heat sink, etc.

As electrical insulating substrate materials according to the prior art, mainly sintered alumina body has been used. However, substrates made from the sintered alumina body are not better in the heat radiation, and consequently development of electrical insulating substrate materials having a better heat radiation has been desired. Such electrical insulating substrate materials must meet the following requirements.

(1) higher electrical resistivity,
(2) higher thermal conductivity,
(3) similar coefficient of thermal expansion to that of Si or GaAs single crystal,
(4) lower dielectric constant or dielectric loss,
(5) higher mechanical strength, etc.

To meet the foregoing requirements, a sintered SiC body containing a Be compound is proposed in Japanese patent application Kokai (Laid-open) No. 57-2591 as an electrical insulating substrate material having a good heat radiation. The proposed sintered body has many characteristics of a substrate material having a good radiation such as a high thermal conductivity, a good electrical insulation, the coefficient of thermal expansion being similar to that of Si single crystal, etc. but its current-voltage characteristics show varistor characteristics, and the electrical resistivity decreases with increasing electric field intensity. Furthermore, its dielectric constant is as large as about 40 at 1 MHz. In other words, a sintered body of SiC-Be compound system cannot be used as an electrical insulating substrate material when the electric field intensity is high, and is not preferable as a substrate material for a circuit that transmits a signal at a high speed.

On the other hand, a sintered AlN body has been developed as a substrate material having a good heat radiation. The sintered AlN body is a material having many characteristics such as higher electrical resistivity and insulating strength, lower dielectric constant, etc., but its thermal conductivity is less than 200 W/m.°K.

Journal of American Ceramic Society 66 (5) C-40 to C-41 (1983) discloses an influence of a hot press temperature upon the thermal conductivity and thermal diffusivity of sintered bodies of SiC-AlN system, where the thermal conductivity of only less than 100 W/m°K. is obtained.

Japanese patent applications Kokai (Laid-open) Nos. 58-91059 and 59-69474 disclose sintered bodies of SiC-AlN system containing a sintering additive and a process for preparing the same. The disclosed sintered bodies have a good electrical insulation, but the thermal conductivity of the sintered bodies disclosed in said Japanese patent application Kokai (Laid-open) No. 58-91059 is maximum 138 W/m/°K., and that disclosed in said Japanese patent application Kokai (Laid-open) No. 59-69474 is maximum 105 W/m°K.

The sintered SiC bodies, sintered AlN bodies and sintered bodies of SiC-AlN system have several, much distinguished characteristics, but are still not satisfactory in several points. The sintered SiC bodies still have tasks such as an increase in the dielectric strength and a decrease in the dielectric constant. The sintered AlN bodies and sintered bodies of SiC-AlN system still have a task such as an increase in the thermal conductivity.

SUMMARY OF THE INVENTION

(1) Objects of the Invention

An object of the present invention is to provide a highly thermal conductive, electrical insulating sintered body having high electrical insulation, dielectric strength and thermal conductivity, and a similar coefficient of thermal expansion to that of Si or GaAs single crystal, low dielectric constant and dielectric loss, and a high mechanical strength, suitable for mounting a Si or GaAs semi-conductor element, a process for preparing the same, and a semi-conductor device.

Another object of the present invention is to provide a semi-conductor device of high heat radiation using the said sintered body of the present invention and a structure mounted with the semi-conductor device.

(2) Statement of the Invention

The present invention provides a highly thermal conductive, electrical insulating sintered aluminum nitride body having at least 90% of theoretical density, which comprises 20 to 40% by weight of silicon carbide, the balance being substantially aluminum nitride, and the silicon carbide containing not more than 0.1% by weight of sum total of boron, aluminum and nitrogen and not more than 0.2% by weight of sum total of iron, titanium, vanadium, chromium and nickel, and the aluminum nitride containing not more than 1% by weight of oxygen and not more than 0.5% by weight of sum total of silicon, iron and magnesium. "At least 90% of theoretical density" means that the thus obtained sintered body has at least 90% of a density obtained by calculation of the theoretical densities of silicon carbide and aluminum nitride, respectively, in view of their mixing ratio. The components of the sintered body of the present invention are so adjusted that thermal conductivity at 20° C. can be at least 250 W/m.°K., an electrical resistivity at 20° C. can be at least $10^{10}$ Ω.cm, and a dielectric strength at 20° C. can be at least 10 kV/cm.

The present invention further provides a highly thermal conductive, electrical insulating sintered aluminum nitride body having at least 90% of theoretical density, which comprises 20 to 40% by weight of silicon carbide, and the balance being substantially aluminum nitride, the silicon carbide containing not more than 0.03% by weight of sum total of boron, aluminum and nitrogen, not more than 0.03% by weight of sum total of iron, vanadium, chromium and nickel and not more than 0.2% by weight of titanium, and the aluminum nitride containing not more than 0.3% by weight of oxygen and not more than 0.2% by weight of sum total of silicon, iron and magnesium, or which comprises 20 to 40% by weight of silicon carbide, the balance being substantially aluminum nitride, the sintered body having a thermal conductivity at 20° C. of at least 250 W/m.°K., an electrical resistivity at 20° C. of at least $10^{10}$ Ω.cm, a dielectric strength at 20° C. of at least 10 kV/cm, and a dielectric constant at 1 MHz of not more than 10, or which comprises 20 to 40% by weight of silicon carbide, the balance being substantially aluminum nitride, the sintered body having a thermal conductivity at 20° C. of at least 250 W/m.°K., an electrical resistivity at 20° C. of at least $10^{10}$ Ω.cm, a dielectric strength at 20° C. of at least 20 kV/cm, a dielectric constant at 1 MHz of not more than 10, a bending strength at 20° C. of at least 400 MPa and a fracture toughness at 20° C. of at least 5 $MN/m^{3/2}$.

The present invention further provides a process for preparing a highly thermal conductive, electrical insulating sintered body, which comprises mixing 20 to 40% by weight of α-type or β-type SiC powder having an average particle size of not more than 20 μm with 80 to 60% by weight of AlN powder having an average particle size of 10 μm, molding the resulting mixture, and sintering the resulting green body at a temperature of 1,750° to 1,900° C. in a non-oxidative atmosphere for a time long enough to make at least 90% of theoretical density.

The present invention still further provides a powder composition for a high thermal conductive, trical insulating sintered aluminum nitride body, which comprises a powder mixture of 20 to 40% by weight of α-type or β-type SiC powder having an average particle size of not more than 20 μm and containing not more than 0.1% by weight of sum total of boron, aluminum and nitrogen and not more than 0.2% by weight of sum total of iron, titanium, vanadium, chromium and nickel with 80 to 60% by weight of AlN powder having an average particle size of not more than 10 μm and containing not more than 1% by weight of oxygen and not more than 0.5% by weight of sum total of silicon, iron and magnesium, or a powder mixture of 20 to 40% by weight of α-type or β-type SiC powder having an average particle size of not more than 20 μm and containing not more than 0.03% by weight of sum total of boron, aluminum and nitrogen, not more than 0.03% by weight of sum total of iron, vanadium, chromium and nickel and not more than 0.2% by weight of titanium, with 80 to 60% by weight of AlN powder having an average particle size of not more than 10 μm and containing not more than 0.3% by weight of oxygen and 0.2% by weight of sum total of silicon, iron and magnesium. A sintered body having at least 90% of theoretical density can be prepared from said powder composition according to said process. That is, the present sintered body can be prepared by sintering a green body of said powder composition at a temperature of 1,750° to 1,900° C. under no load in a non-oxidative atmosphere, or sintering the green body by a hot press at a temperature of 1,600° to 1,900° C. under a load of at least 10 MPa in a non-oxidative atmosphere, or sintering the green body by a hot isostatic press at a temperature of 1,600° to 1,900° C. under a load of at least 10 MPa in a non-oxidative atmosphere.

The present invention still further provides a semiconductor element device having a high radiation characteristic provided with a semi-conductor element mounted on a ceramic substrate of said sintered body.

Said objects of the present invention can be attained by densely sintering a powder mixture of SiC powder on high purity, particularly SiC powder containing less impurities acting as an acceptor or a donor having a large influence upon the thermal and electric characteristics in SiC crystals with AlN powder of high purity at a temperature low enough substantially not to allow both SiC powder and AlN powder to undergo solid solution.

SiC is a material having a very strong covalent bonding and is known to be one of materials that hardly turn into a densely sintered body. Furthermore, SiC is similar to diamond in the crystal structure, and pure SiC single crystal of good crystal structure has a very high thermal conductivity. However, SiC is originally a semi-conductor compound of elements of group IV—IV, and its electrical resistivity is abruptly decreased even if a very small amount of B, Al or N is contained as an impurity acting as an electrically active acceptor or donor through solid solution, and usually no higher electrical resistivity can be obtained. The smaller the content of the impurities in the SiC crystal, particularly that of B, Al or N as impurities acting as electrically active acceptor or donor in the SiC crystal, the higher the thermal conductivity of SiC. Furthermore, SiC characteristically has a coefficient of thermal expansion quite similar to that of Si single crystal.

On the other hand, AlN is similar to diamond in the crystal structure and it is known that pure AlN single crystal of good crystal structure has a relatively high thermal conductivity, and also that AlN has a very large electrical resistivity. Furthermore, AlN characteristically has a coefficient of thermal expansion similar to that of GaAs single crystal.

In the present invention, SiC powder having an average particle size of not more than 20 μm and containing not more than 0.1% by weight of impurities acting as electrically active acceptor or donor in the SiC crystal is used. The element acting as an acceptor in the SiC crystal includes, for example, B, Al, etc., and the element acting as a donor includes, for example, N. The reason why in the SiC powder for use in the present invention the content of the impurities acting as an acceptor or a donor in the SiC crystal is not more than 0.1% by weight is that these impurities have a considerably large influence upon the thermal conductivity and the electrical resistivity of SiC, where the larger the content of the impurities, the lower the thermal conductivity and the electrical resistivity, and so long as the content of the impurities is kept to less than 0.1% by weight in the SiC powder, a sintered body having high thermal conductivity and electrical resistivity can be obtained.

In the present invention, it is desirable that the electrical resistivity of SiC itself is higher, but since AlN largely contributes to the electrical resistivity of the entire sintered body, as will be described later, the electrical resistivity of SiC may be regarded as not so important. SiC powder having an average particle size of not more than 20 µm must be used. If the particle size of SiC powder is too large, linking of SiC grains having a low electrical resistivity is liable to take place when sintered, and sites of low electrical resistivity may occur locally in the sintered body. Furthermore, the average particle size of the SiC powder is too large, it is hard to obtain a sintered dense body. So long as the average particle size is not more than 20 µm, a sintered dense body can be obtained by thorough mixing of the powder without any of said problems. Crystal type, that is, α-type or β-type, or the SiC powder particularly has no problem. α-Type SiC powder is prepared by making an ingot of SiC usually according to Acheson process and then pulverizing the ingot. Contamination and solid solution of a very small amount of nitrogen from the atmosphere makes SiC a n-type semi-conductor. Needless to say, it is possible to allow B or Al to undergo solid solution in an amount less than said upper limit, thereby making SiC a p-type semi-conductor. According to the foregoing procedure, SiC powder with less crystal lattice defect is characteristically liable to be obtained and a sintered body having a higher thermal conductivity is liable to be formed.

On the other hand, β-type SiC powder can be prepared usually according to a gas phase process, and SiC powder of very high purity having very small particle sizes is characteristically liable to be obtained.

On the other hand, the AlN powder for use in the present invention must have an average particle size of not more than 10 µm and must contain not more than 1% by weight of oxygen as an impurity and not more than 0.5% by weight of cations as impurities. The reason why the AlN powder for use in the present invention must contain not more than 1% by weight of oxygen as an impurity and not more than 0.5% by weight of cations as impurities is that, if the contents of these impurities are larger than the upper limits, respectively, the thermal conductivity is considerably lowered. The AlN powder having an average particle size of not more than 10 µm must be used. If the article size of the AlN powder is too large, it is hard to obtain a sintered dense body, and also another disadvantage of too large a particle size of the AlN powder is that distribution of the SiC crystal grains and the AlN crystal grains is liable to be not uniform in the sintered body, and the SiC crystal grains themselves are linked to one another, causing to locally form sites of low electrical resistivity in the sintered body.

In preparing a sintered body, it is necessary to take into account the following points.

First of all, a mixing ratio of the SiC powder to the AlN powder should be taken into account. It is necessary to contain at least 20% by weight of SiC. If the content of SiC is less than 20% by weight, it is hard to obtain a sintered body having a high thermal conductivity. Furthermore, it is necessary that the content of SiC be not more than 40% by weight in the case of pressureless sintering. On the other hand, SiC can be mixed up to 50% by weight in the case of hot press sintering. The reason why the content of character SiC must be not more than 40% by weight in the case of pressureless sintering is that, if the content of SiC exceeds 40% by weight, any sintered dense body can be no more obtained owing to the strong covalent bonding of SiC and the absence of auto-sintering of SiC, and thus no sintered body having high thermal conductivity and electrical resistivity can be obtained.

In the case of hot press sintering, sintering is carried out under a load, and thus a sintered body is more densified than in the case of pressureless sintering. A sintered, thoroughly dense body having high thermal conductivity and electrical resistivity can be obtained up to the SiC content of 50% by weight. However, if the content of SiC exceeds 50% by weight, any sintered body having a high electrical resistivity can be no more obtained owing to the presence of too large an amount of SiC having a low electrical resistivity.

In the case of preparing a sintered body by a hot isostatic press, sintering of green body is accelerated under an external load, and thus a sintered body having high thermal conductivity and electrical resistivity can be obtained up to 50% by weight of SiC as in the case of hot press sintering.

In order to obtain a sintered dense body having high thermal conductivity and electrical resistivity, it is necessary to appropriately select particle sizes of SiC powder and AlN powder as starting materials. Generally, the finer the SiC powder and AlN powder, the more easily the sintering can be carried out and the lower the sintering temperature is available. In the case of pressureless sintering, where a green body is sintered under no load, an average particle size of both SiC powder and AlN powder is preferably not more than 1.0 µm, whereas in the case of preparing a sintered body by a hot press or hot isostatic press, an average particle size of SiC powder can be not more than 20 µm and that of AlN powder can be not more than 10 µm, because a green body is sintered under an extenal load, and a sintered dense body having high thermal conductivity and electrical resistivity can be obtained thereby. However, even in the case of preparing a sintered by a hot press or hot isostatic press, the smaller the average particle sizes of both SiC powder and AlN powder, the more readily a sintered, dense body having higher thermal conductivity and electrical resistivity can be obtained at a lower sintering temperature.

In order to facilitate green body of a mixture of SiC powder and AlN powder as a pretreatment for obtaining a sintered body, a binder is added to the mixture. Various organic materials are known as the binder, and even if an organic binder is used as the binder for preparing a sintered body of the present invention, a sintered body having satisfactory properties as desired can be obtained. Some binder needs water as a solvent for dissolving the binder, but it is not preferable to use water as the solvent. Water used as the solvent reacts with AlN and the thermal conductivity of a sintered body is lowered owing to the resulting oxidation of AlN.

It is necessary to thoroughly mix SiC, AlN and a binder to make a uniform mixture. Mixing can be carried out according to various so far known methods, and a sintered body of the present invention having properties as desired can be obtained even if the mixing is carried out according to any of the so far known mixing methods, where it is essential for the mixing to make a thoroughly uniform composition of said component materials. Particularly when SiC grains are not thoroughly uniformly distributed and mixed, the SiC grains themselves are linked to one another, causing to form a sintered body locally having sites of considerably low electrical resistivity.

In order to obtain a uniform green molding from the powder mixture, it is preferable to pelletize the powder mixture according to an appropriate method A sintered body of the present invention having properties as desired can be likewise obtained even if the pelletizing is carried out according to any of the so far known pelletizing methods. After the mixing and pelletization, the powder mixture is subjected to preliminary molding, i.e. molding as a successive step. Various methods are available for the preliminary molding and it can be carried out according to a method selected in view of the shape of final product. However, a sintered body of the present invention having properties as desired can be obtained, even if the preliminary molding and processing successive to the preliminary molding are carried out according to any of the so far known molding and processing methods.

There are several important conditions for preparing a sintered body by sintering the green body. The sintering atmosphere must be a non-oxidative atmosphere. Specifically, a vacuum and a non-oxidative gas atmosphere such as hydrogen, nitrogen, helium, neon, argon, a gas mixture of hydrogen and nitrogen, etc. are available. If the sintering is carried out in an oxidative atmosphere, SiC and AlN, particularly AlN, are considerably oxidized, and thus a sintered body having a high thermal conductivity cannot be obtained.

Sintering temperature is very important for obtaining a sintered body of the present invention. The lowest sintering temperature depends upon various conditions. The sintering temperature is 1,600° C. even as the lowest temperature, where sintering is carried out under a load by a hot press or hot isostatic press. When the sintering temperature is lower than 1,600° C. in that case, no sintered, dense body can be obtained, or only a sintered body having a considerably low thermal conductivity and a low electrical resistivity can be obtained. When the green body is sintered under no external load, the lowest sintering temperature is 1,750° C. When the sintering temperature is lower than the lowest sintering temperature in said cases, any sintered dense body cannot be obtained, and the resulting sintered body will have a lower thermal conductivity and a low electrical resistivity. The highest sintering temperature is 1,900° C. in said cases. When the sintering temperature is higher than 1,900° C., the amount of Al and N to be diffused into the SiC crystal lattice is no more negligible, though the resulting sintered body is thoroughly densified. Al is trivalent and works as an acceptor in the SiC crystal, whereas N is pentavalent and works as a doner. Thus, the electrical resistivity and thermal conductivity of a sintered body will be considerably lower by diffusion of Al and N into the SiC crystal and by the resulting solid solution. When the sintering temperature is not more than 1,900° C., the amount of Al and N to be diffused into the SiC crystal to undergo solid solution is small, and thus a sintered body can be obtained without any considerable lowering of the electrical resistivity and thermal conductivity.

Optimum sintering time depends upon a combination of various conditions. Particularly at a sintering temperature above 1,850° C., the amount of Al and N to be diffused into the SiC crystal will be increased when sintered for a long time, resulting in a sintered body having low thermal conductivity and electrical resistivity.

In the present invention, a green body can be sintered either under a load or under no load, or by a combination of these two procedures. A sintered body of the present invention having properties as desired can be obtained according to any of these procedures. A sintered dense body having higher thermal conductivity and electrical resistivity can be more easily prepared by sintering under a load than by sintering under no load.

In the foregoing, conditions for preparing a sintered body have been described. A sintered body prepared by satisfying these conditions is characterized by a high density, a high thermal conductivity, a good electrical insulation, a high dielectric strength, a similar coefficient of thermal expansion to that of Si or GaAs single crystal, and a low dielectric constant, and is a substrate material very suitable for mounting semi-conductors such as Si, GaAs, etc.

EXAMPLE 1

Figure 1:
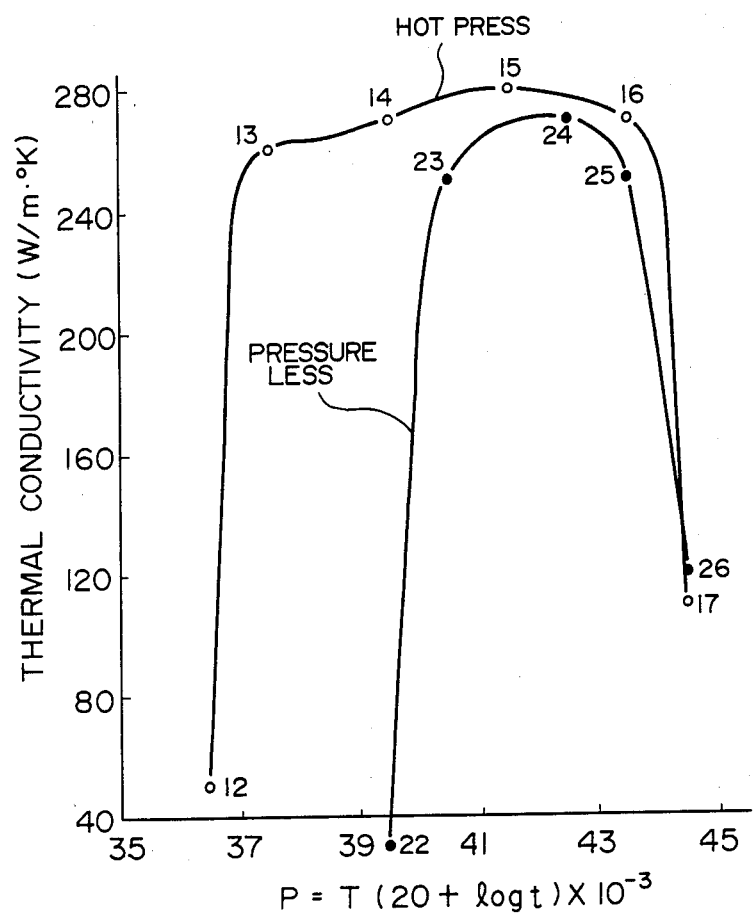
FIG. 1 is a diagram showing a relationship between P and thermal conductivity.

SiC powder used as a starting material had the following particulars:
  Average particle size: 0.5 μm
  Crystal type: α-type
  Amounts of impurities (% by weight):
    Free silicon: 0.86
    Free silica: 2.10
    Free carbon: 0.30
    Boron: 0.001
    Aluminum: 0.008
    Iron: 0.006
    Titanium: 0.12
    Vanadium: 0.003
    Chromium: 0.005
    Nickel: 0.003
    Nitrogen: 0.008
    Sum total of boron, aluminum and nickel: 0.0018
    Sum total of iron, titanium, vanadium, chronium and nickel: 0.137
    Sum total of iron, vanadium, chromium and nickel: 0.017

AlN powder used as a starting material had the following particulars:
  Average particle size: 0.8 μm
  Crystal type: Hexagonal system
  Amount of impurities (% by weight):
    Oxygen: 0.08
    Carbon: 0.15
    Silicon: 0.01
    Iron: 0.08
    Magnesium: 0.05
    Other cations: 0.01
    Sum total of silicon, iron and magnesium: 0.14

A sintered body was prepared in the following manner:

15.0 g of SiC powder and 30.0 g of AlN powder were weighed out, placed into a pot made of SiC, and subjected to ball mill mixing with balls made of SiC for 20 hours. Then, 20 ml of a 5% polybutyl alcohol solution in n-butyl alcohol was added to the powder mixture, and the mixture was further subjected to the ball mill mixing for one hour. Then, n-butyl alcohol was evaporated off the powder mixture. Then, the powder mixture was sieved through a 64-mesh screen to remove coarse grains. Then, the sieved powder mixture was placed into a mold, 60 mm in inner diameter, and of at least 3.1 g/cm³ and can have a thermal conductivity at 20° C. of at least 250 W/m.°K., an electrical resistivity at 20° C. of at least $10^{11}$ Ω.cm, a dielectric strength at 20° C. of at least 10 kV/cm, a coefficient of thermal expansion at 20°-400° C. of 4.0-4.4×$10^{-6}$/°C., and a dielectric constant at 1 MHz of not more than 15, and thus have very suitable characteristics as substrate materials for mounting semi-conductor elements.

TABLE 1

| No. | SiC (wt %) | AlN (wt %) | Density g/cm³ | Thermal conductivity W/m·°K. | Electrical resistivity Ω·cm | Dielectric strength kV/cm | Coefficient of thermal expansion × $10^{-6}$/°C. | Dielectric constant | Dielectric loss |
|---|---|---|---|---|---|---|---|---|---|
| 1 | 15 | 85 | 3.25 | 200 | $3 \times 10^{11}$ | >50 | 4.6 | 8.9 | 0.0004 |
| 2 | 20 | 80 | 3.24 | 250 | $1 \times 10^{14}$ | >50 | 4.4 | 9.0 | 0.0006 |
| 3 | 33 | 67 | 3.23 | 280 | $7 \times 10^{12}$ | >20 | 4.3 | 9.8 | 0.001 |
| 4 | 40 | 60 | 3.22 | 290 | $4 \times 10^{11}$ | >10 | 4.2 | 10.6 | 0.005 |
| 5 | 50 | 50 | 3.15 | 330 | $6 \times 10^{10}$ | >10 | 4.1 | 12.7 | 0.008 |
| 6 | 60 | 40 | 2.77 | 140 | $8 \times 10^{16}$ | — | 4.0 | — | — |

TABLE 2

| No. | SiC (wt %) | AlN (wt %) | Density g/cm³ | Thermal conductivity W/m·°K. | Electrical resistivity Ω·cm | Dielectric strength kV/cm | Coefficient of thermal expansion × $10^{-6}$/°C. | Dielectric constant | Dielectric loss |
|---|---|---|---|---|---|---|---|---|---|
| 7  | 15 | 85 | 3.23 | 190 | $1 \times 10^{11}$ | >50 | 4.6 | 9.1 | 0.0008 |
| 8  | 20 | 80 | 3.20 | 250 | $8 \times 10^{13}$ | >40 | 4.4 | 9.8 | 0.001 |
| 9  | 33 | 67 | 3.18 | 270 | $5 \times 0^{11}$ | >20 | 4.3 | 11.6 | 0.007 |
| 10 | 40 | 60 | 3.10 | 280 | $2 \times 10^{10}$ | >10 | 4.2 | 14.2 | 0.01 |
| 11 | 50 | 50 | 2.11 | 30  | $4 \times 10^{4}$  | — | 4.1 | — | — | pressed under a load of 100 MPa. Then, the green body was placed in a graphite mold and the graphite mold was set in a furnace. After the furnace was brought into vacuum, the green body was heated while placing the green body in the graphite mold under a load of 30 MPa and kept at 1,800° C. for one hour, whereby a sintered body was obtained.

In the same manner as above, sintered bodies having compositions shown in Table 1 were prepared. The sintered body No. 3 shown in Table 1 had the same composition as described above. In Table 1, characteristics of the thus obtained sintered bodies are shown together. It is obvious from Table 1 that, so long as 20 to 50% by weight of SiC is contained (the balance is AlN), the sintered bodies can have a thermal conductivity at 20° C. of at least 250 W/m.°K., an electrical resistivity at 20° C. of at least $10^{10}$ Ω.cm, a dielectric strength at 20° C. of at least 10 kV/cm, a coefficient of thermal expansion at 20°-400° C. of 4.0-4.4×$10^{-6}$/°C., and a dielectric constant at 1 MHz of not more than 10, and thus have very suitable characteristics as substrate materials for mounting semi-conductor elements.

EXAMPLE 2

Using the same SiC powder and AlN powder as in Example 1 as starting materials, powder compositions having different mixing ratios of SiC powder to AlN powder and their green bodies were prepared therefrom in the same manner as in Example 1. Then, the green bodies were placed in graphite crucible, and the graphite crucibles were set in a furnace. After the furnace was brought into vacuum, the green bodies were heated and kept at 1,850° C. for one hour, whereby sintered bodies were obtained.

Table 2 shows the characteristics of the thus obtained sintered bodies. It is obvious from Table 2 that, so long as 20 to 40% by weight of SiC is contained (the balance is AlN), the sintered body can be densified to a density

EXAMPLE 3

The same SiC powder and AlN powder as in Example 1 were used as starting materials. 15.0 g of SiC powder and 30.0 g of AlN powder were weighed out and green bodies were prepared therefrom in the same manner as in Example 1. The green bodies were placed into respective graphite molds, and the graphite molds were set into a furnace. After the furnace was brought into vacuum, the green bodies were heated while placing the green body in the graphite mold under a load of 30 MPa by a hot press, whereby sintered bodies was obtained. In this Example, sintered bodes were prepared by changing the hot-press sintering temperature to various degrees while keeping the sintering time for one hour.

Table 3 shows characteristics of the thus obtained sintered bodies. It is obvious from Table 3 that, so long as the hot-press sintering temperature is in a range of 1,600° to 1,900° C., the sintered body can be densified to a density of at least 3.1 g/cm³, and has suitable characteristics as substrate materials for mounting semi-conductor elements.

FIG. 1 is a diagram showing a relationship between parameter P given by hot-press temperature and time according to the following formula and the thermal conductivity at 20° C.

$$P = T(20 + \log t) \times 10^{-3}$$

wherein T:
absolute temperature (°K.)
t: time (hour)

As shown in FIG. 1, a high thermal conductivity can be obtained when P is in a range of 37 to 44.

EXAMPLE 4

The same SiC powder and AlN powder as in Example 1 were used as starting materials. 15.0 g of SiC powder and 30.0 g of AlN powder were weighed out, and green bodies were prepared therefrom in the same manner as in Example 1. Then, the green bodies were placed into respective graphite molds, and the graphite molds were set into a furnace. After the furnace was brought into vacuum, the green bodies were heated while placing the green bodies in the graphite molds under various loads, and hot-pressed at 1,800° C. for one hour, whereby sintered bodies were obtained.

Table 4 shows characteristics of the thus obtained sintered bodies. It is obvious from Table 4 that, so long as the hot-press load is at least 10 MPa, the sintered body can be densified to a density of at least 3.1 g/cm$^3$ and has suitable characteristics as substrate materials for mounting semi-conductor elements.

EXAMPLE 5

The same SiC powder and AlN powder as in Example 1 were used as starting materials. 15.0 g of SiC powder and 30.0 g of AlN powder were weighed out and green bodies were prepared therefrom in the same manner as in Example 1. Then, the green bodies were placed in respective graphite crucibles and the graphite crucibles were set into a furnace. After the furnace was brought into vacuum, the green bodies were heated and sintered at various sintering temperatures for one hour under no load.

Table 5 shows characteristics of the thus obtained sintered bodies. It is obvious from Table 5 that, so long as the sintering temperature is in a range of 1,750° to 1,900° C., the sintered body can be densified to a density of at least 3.1 g/cm$^3$, and has suitable characteristics as substrate materials for mounting semiconductor elements.

As shown in FIG. 1, a high thermal conductivity can be obtained in the case of pressureless sintering when P is in a range of about 40 to about 44.

TABLE 3

| No. | Hot-press temp. °C. | Density g/cm$^3$ | Thermal conductivity W/m·°K. | Electrical resistivity Ω·cm |
|---|---|---|---|---|
| 12 | 1550 | 2.33 | 50 | $3 \times 10^4$ |
| 13 | 1600 | 3.11 | 260 | $4 \times 10^{11}$ |
| 14 | 1700 | 3.17 | 270 | $1 \times 10^{12}$ |
| 15 | 1800 | 3.23 | 280 | $7 \times 10^{12}$ |
| 16 | 1900 | 3.24 | 270 | $2 \times 10^{12}$ |
| 17 | 1950 | 3.24 | 110 | $7 \times 10^7$ |

TABLE 4

| No. | Hot-press load MPa | Density g/cm$^3$ | Thermal conductivity W/m·°K. | Electrical resistivity Ω·cm |
|---|---|---|---|---|
| 18 | 5 | 2.66 | 70 | $9 \times 10^4$ |
| 19 | 10 | 3.12 | 260 | $3 \times 10^{11}$ |
| 20 | 30 | 3.23 | 280 | $7 \times 10^{12}$ |
| 21 | 50 | 3.24 | 290 | $8 \times 10^{12}$ |

TABLE 5

| No. | Sintering temp. °C. | Density g/cm$^3$ | Thermal conductivity W/m·°K. | Electrical resistivity Ω·cm |
|---|---|---|---|---|
| 22 | 1700 | 2.12 | 30 | $1 \times 10^4$ |
| 23 | 1750 | 3.10 | 250 | $2 \times 10^{10}$ |
| 24 | 1850 | 3.18 | 270 | $5 \times 10^{11}$ |
| 25 | 1900 | 3.18 | 250 | $6 \times 10^{10}$ |
| 26 | 1950 | 3.20 | 120 | $8 \times 10^6$ |

EXAMPLE 6

The same SiC powder and AlN powder as in Example 1 were used as starting materials. 15.0 g of SiC powder and 30.0 g of AlN powder were weighed out, and green bodies were prepared therefrom in the same manner as in Example 1. Then, the green bodies were placed in respective graphite molds, and the graphite molds were set into a furnace. After the furnace was brought into vacuum, the green bodies were heated, while placing the green bodies in the graphite molds under a load of 30 MPa and sintered by hot press. In this example, sintered bodies were obtained by changing the hot-press temperature and time to various degrees.

Table 6 shows characteristics of the thus obtained sintered bodies. It is obvious from Table 6 that, when the hot-press temperature is below 1,600° C., no sintered, dense body can be obtained even by prolonging the hot-press time, whereas, when the hot-press temperature is as high as 1,900° C., the thermal conductivity and electrical resistivity of a sintered body will be lowered by prolonging the hot-press time too much, and further that, when the hot-press temperature exceeds 1,900° C., the thermal conductivity and electrical resistivity of a sintered body are low even for a short hot-press time.

The green bodies prepared in the same manner as above were placed in respective graphite crucibles, and sintered in the same manner as in Example 2. In this case, sintered bodies were obtained by changing the sintering temperature and time.

Table 7 shows characteristics of sintered bodies obtained by said pressureless sintering. It is obvious from Table 7 that a sintering temperature below 1,700° C., no sintered, dense body can be obtained even by prolonging the sintering time, whereas at a sintering temperature as high as 1,900° C., the thermal conductivity and electrical resistivity of a sintered body will be lowered by prolonging the sintering time too much, and further that, when the sintering time exceeds 1,900° C., the thermal conductivity and electrical resistivity of a sintered body will be lowered even by shortening the sintering time.

TABLE 6

| No. | Hot-press temp. °C. | Hot-press time h | Density g/cm$^3$ | Thermal conductivity W/m·°K. | Electrical resistivity Ω·cm |
|---|---|---|---|---|---|
| 27 | 1550 | 8 | 2.40 | 60 | $6 \times 10^4$ |
| 28 | 1600 | 5 | 3.12 | 260 | $1 \times 10^{12}$ |
| 29 | 1900 | 5 | 3.19 | 170 | $6 \times 10^7$ |
| 30 | 1900 | 3 | 3.19 | 220 | $8 \times 10^8$ |
| 31 | 1950 | 0.3 | 3.18 | 150 | $3 \times 10^6$ |

TABLE 7

| No. | Sintering temp. °C. | Sintering time h | Density g/cm$^3$ | Thermal conductivity W/m·°K. | Electrical resistivity Ω·cm |
|---|---|---|---|---|---|
| 32 | 1700 | 8 | 2.15 | 30 | $2 \times 10^4$ |

TABLE 7-continued

| No. | Sintering temp. °C. | Sintering time h | Density g/cm³ | Thermal conductivity W/m·°K. | Electrical resistivity Ω·cm |
|---|---|---|---|---|---|
| 33 | 1750 | 5 | 3.11 | 250 | $2 \times 10^{10}$ |
| 34 | 1900 | 3 | 3.18 | 210 | $5 \times 10^{9}$ |
| 35 | 1950 | 0.3 | 3.18 | 130 | $1 \times 10^{6}$ |

EXAMPLE 7

The same SiC powder and AlN powder as in Example 1 were used as starting materials, and 15.0 g of SiC powder and 30.0 g of AlN powder were weighed out. Green bodies were prepared therefrom in the same manner as in Example 1. The green bodies were sintered by hot press in the same manner as in Example 1, or sintered under no load in the same manner as in Example 2 to prepare sintered bodies. In this Example, the sintering atmosphere was changed in the following manner.

After the furnace was brought into vacuum, a predetermined species of gas was introduced into the furnace up to the atmospheric pressure, and thereafter the gas was continuously passed through the furnace at a flow rate of 3 l/min. The gas species used were nitrogen, hydrogen, helium, neon, argon, and a gas mixture of 80% nitrogen and 20% hydrogen.

The thus obtained sintered bodies had the same characteristics as those of No. 3 in Table 1, when sintered by hot press in any of the gas atmospheres of said gas species, and the same characteristics as those of No. 9 in Table 2 when sintered under no load in any of the gas atmospheres of said gas species.

EXAMPLE 8

The same SiC powder and AlN powder as in Example 1 were used as starting materials, and 15.0 g of SiC powder and 30.0 g of AlN powder were weighed out. Green bodies were prepared therefrom in the same manner as in Example 1. The green bodies were placed into respective Pyrex glass capsules, and the capsules were brought into vacuum and sealed. Then, the capsules were heated and pressed by hot isostatic press, using argon as an atmospheric gas. Sintered bodies were obtained by changing the temperature and gas pressure when sintered by hot isostatic press. The hot isostatic press is carried out at predetermined temperatures and gas pressure for one hour.

Table 8 shows characteristics of the thus obtained sintered bodies. It is obvious from Table 8 that a sintered body can have suitable characteristics as a substrate material for mounting semiconductor elements by sintering the green body at a temperature of 1,600° to 1,900° C. and a gas pressure of at least 10 MPa by hot isostatic press.

TABLE 8

| No. | Temperature °C. | Gas pressure Mpa | Density g/cm³ | Thermal conductivity W/m·°K. | Electrical resistivity Ω·cm |
|---|---|---|---|---|---|
| 36 | 1550 | 200 | 2.88 | 100 | $6 \times 10^{8}$ |
| 37 | 1600 | 100 | 3.16 | 270 | $3 \times 10^{12}$ |
| 38 | 1600 | 10 | 3.11 | 260 | $1 \times 10^{12}$ |
| 39 | 1800 | 100 | 3.23 | 290 | $9 \times 10^{12}$ |
| 40 | 1800 | 10 | 3.20 | 270 | $4 \times 10^{12}$ |
| 41 | 1900 | 100 | 3.23 | 260 | $7 \times 10^{10}$ |
| 42 | 1900 | 10 | 3.23 | 250 | $4 \times 10^{10}$ |
| 43 | 1950 | 100 | 3.23 | 110 | $5 \times 10^{5}$ |

EXAMPLE 9

SiC powder having the same particulars as in Example 1 except for the average particle size and the contents of free silicon (Si), free carbon (C) and free silica (SiO$_2$) was used as a starting material, and the same AlN powder as in Example 1 was used as a starting material. The smaller the average particle size of SiC powder, the higher the contents of free silicon, free carbon and free silica, because the specific surface area of SiC powder increases with finer powder. Contents of other impurities were identical within the analytical errors with those of SiC powder as in Example 1, because the SiC powder was prepared by pulverizing the same SiC ingot as in Example 1, followed by sieving.

15.0 g of SiC powder and 30.0 g of AlN powder were weighed out and green bodies were prepared therefrom and sintered by hot press in the same manner as in Example 1, whereby sintered bodies were prepared.

Table 9 shows characteristics of the thus obtained sintered bodies. It is obvious from Table 9 that, so long as the average particle size of SiC powder is not more than 20 μm, a sintered body can be densified to a density of at least 3.1 g/cm³ and thus has suitable properties as a substrate material for mounting semiconductor elements.

On the other hand, green bodies as prepared in the same manner were sintered under no load in the same manner as in Example 2 to obtain sintered bodies.

Table 10 shows characteristics of the sintered bodies obtained by pressureless sintering. It is obvious from Table 10 that, so long as the average particle size of SiC powder is not more than 1.0 μm, a sintered body can be densified to a density of at least 3.1 g/cm³ and has suitable properties as a substrate material for mounting semi-conductor elements.

TABLE 9

| No. | Average particle size μm | Density g/cm³ | Thermal conductivity W/m·°K. | Electrical resistivity Ω·cm |
|---|---|---|---|---|
| 45 | 0.2 | 3.23 | 280 | $8 \times 10^{12}$ |
| 46 | 2.0 | 3.23 | 280 | $7 \times 10^{12}$ |
| 47 | 10 | 3.15 | 270 | $5 \times 10^{11}$ |
| 48 | 20 | 3.11 | 270 | $3 \times 10^{10}$ |
| 49 | 30 | 2.82 | 190 | $8 \times 10^{8}$ |

TABLE 10

| No. | Average particle size μm | Density g/cm³ | Thermal conductivity W/m·°K. | Electrical resistivity Ω·cm |
|---|---|---|---|---|
| 49 | 0.05 | 3.20 | 270 | $1 \times 10^{12}$ |
| 50 | 0.2 | 3.19 | 270 | $8 \times 10^{11}$ |
| 51 | 1.0 | 3.10 | 250 | $3 \times 10^{10}$ |
| 52 | 2.0 | 2.31 | 60 | $6 \times 10^{5}$ |

EXAMPLE 9

The same SiC powder as in Example 1 was used as a starting material and AlN powder having the same particulars as in Example 1 except for the average particle size was used as a starting material.

15.0 g of SiC powder and 30.0 g of AlN powder were weighed out, and green bodies were prepared therefrom in the same manner as in Example 1. Then, the green bodies were sintered by hot press in the same manner as in Example 1 or sintered under no load in the same manner as in Example 2 to obtain sintered bodies.

Table 1 shows characteristics of the thus obtained sintered bodies, where Nos. 53-56 relate to the sintered bodies obtained by hot press and Nos. 57-59 relate to those obtained by pressureless sintering. It is obvious from Table 11 that, so long as the average particle size of AlN powder is not more than 10 μm in the case of hot-press sintering and that of AlN powder is not more than 1.0 μm in the case of pressureless sintering, a sintered body can be densified to a density of at least 3.1 g/cm$^3$ and has suitable characteristics as a substrate material for mounting semi-conductor elements.

TABLE 11

| No. | Average particle size μm | Density g/cm$^3$ | Thermal conductivity W/m·°K. | Electrical resistivity Ω·cm |
|---|---|---|---|---|
| 53 | 0.4 | 3.23 | 280 | 9 × 10$^{12}$ |
| 54 | 2.0 | 3.20 | 270 | 4 × 10$^{12}$ |
| 55 | 10 | 3.11 | 250 | 4 × 10$^{11}$ |
| 56 | 20 | 2.14 | 80 | 7 × 10$^6$ |
| 57 | 0.4 | 3.18 | 270 | 8 × 10$^{11}$ |
| 58 | 1.0 | 3.10 | 250 | 7 × 10$^{10}$ |
| 59 | 2.0 | 2.03 | 40 | 6 × 10$^4$ |

EXAMPLE 10

15.0 g of SiC powder shown in Table 12 and 30.0 g of the same AlN powder as in Example 1 were weighed out as starting materials, and green bodies were prepared therefrom in the same manner as in Example 1 and sintered by hot press in the same manner as in Example 1 to obtain sintered bodies.

Table 13 shows characteristics of the thus obtained sintered bodies. It is obvious from Table 13 that all the sintered bodies are densified to a density of at least 3.1 g/cm$^3$, and so long as the contents of Be, B, Al and N are not more than 0.1% by weight, respectively, and the contents of other cationic impurities are not more than 0.2% by weight, respectively, they have suitable characteristics as substrate materials for mounting semi-conductor materials.

EXAMPLE 11

15.0 g of the same SiC powder as in Example 1 and 30.0 g of AlN powder shown in Table 14 were weighed out as starting materials. Green bodies were prepared therefrom in the same manner as in Example 1, and sintered by hot press in the same manner as Example 1 to obtain sintered bodies.

Table 15 shows characteristics of the thus obtained sintered bodies. It is obvious from Table 15 that all the sintered bodies are densified to a density of at least 3.1 g/cm$^3$, and, so long as the content of oxygen as the impurity is not more than 1% by weight and the contents of cationic impurities are 0.5% by weight, respectively, they have suitable characteristics as substrate materials for mounting semi-conductor elements.

TABLE 12

| No. | 60 | 61 | 62 | 63 | 64 | 65 |
|---|---|---|---|---|---|---|
| Average particle size (μm) | 0.8 | 1.0 | 0.8 | 0.7 | 0.7 | 0.8 |
| Crystal type | α | α | α | α | α | α |
| Impurities (wt %) | | | | | | |
| Free silicon | 0.75 | 0.71 | 0.77 | 0.80 | 0.81 | 0.77 |
| Free silica | 1.85 | 1.74 | 1.88 | 1.88 | 1.90 | 1.80 |
| Free carbon | 0.22 | 0.20 | 0.24 | 0.27 | 0.30 | 0.23 |
| Beryllium | — | 0.12 | — | — | — | — |
| Boron | 0.001 | 0.002 | 0.15 | 0.002 | 0.001 | 0.001 |
| Aluminum | 0.006 | 0.005 | 0.008 | 0.12 | 0.02 | 0.002 |
| Iron | 0.005 | 0.005 | 0.006 | 0.006 | 0.11 | 0.003 |
| Titanium | 0.10 | 0.16 | 0.14 | 0.12 | 0.14 | 0.08 |
| Vanadium | 0.005 | 0.008 | 0.003 | 0.005 | 0.07 | 0.003 |
| Chronium | 0.007 | 0.007 | 0.005 | 0.005 | 0.11 | 0.005 |
| Nickel | 0.003 | 0.003 | 0.004 | 0.004 | 0.01 | 0.003 |
| Nitrogen | 0.11 | 0.006 | 0.008 | 0.008 | 0.008 | 0.003 |

TABLE 13

| No. | Density g/cm$^3$ | Thermal conductivity W/m·°K. | Electrical resistivity Ω·cm |
|---|---|---|---|
| 60 | 3.23 | 150 | 3 × 10$^2$ |
| 61 | 3.23 | 210 | 8 × 10$^{12}$ |
| 62 | 3.23 | 160 | 4 × 10$^8$ |
| 63 | 3.23 | 120 | 7 × 10$^4$ |
| 64 | 3.23 | 170 | 5 × 10$^7$ |
| 65 | 3.23 | 290 | 1 × 10$^{13}$ |

TABLE 14

| No. | 66 | 67 | 68 | 69 | 70 |
|---|---|---|---|---|---|
| Average particle size (μm) | 0.7 | 0.8 | 1.0 | 0.8 | 0.8 |
| Crystal type | Hexagonal | Hexagonal | Hexagonal | Hexagonal | Hexagonal |
| Impurities (wt %) | | | | | |
| Oxygen | 1.2 | 0.8 | 0.8 | 0.6 | 0.8 |
| Carbon | 0.15 | 0.10 | 0.15 | 0.10 | 0.17 |
| silicon | 0.08 | 0.48 | 0.10 | 0.08 | 0.10 |
| Iron | 0.06 | 0.20 | 0.10 | 0.10 | 0.44 |
| Magnesium | 0.04 | 0.10 | 0.04 | 0.02 | 0.06 |
| Sodium | — | — | 0.02 | — | — |

TABLE 15

| No. | Density g/cm$^3$ | Thermal conductivity W/m·°K. | Electrical resistivity Ω·cm |
|---|---|---|---|
| 66 | 3.23 | 150 | 5 × 10$^{11}$ |
| 67 | 3.22 | 190 | 4 × 10$^{11}$ |
| 68 | 3.23 | 200 | 8 × 10$^9$ |
| 69 | 3.23 | 290 | 7 × 10$^{12}$ |
| 70 | 3.23 | 210 | 6 × 10$^{10}$ |

EXAMPLE 12

SiC powder having the following particulars was used as a starting material.
Average particle size: 0.3 μm
Crystal type: β
Impurities (% by weight):
  Free silicon: 0.30
  Free silica: 0.32
  Free carbon: 0.38
  Aluminum: 0.002
  Iron: 0.004
  Nitrogen: 0.006

The same AlN powder as in Example 1 was used as a starting material. 15.0 g of SiC powder and 30.0 g of AlN powder were weighed out, and a green body was prepared therefrom and sintered by hot press in the same manner as in Example 1. The thus obtained sintered body had the same characteristics as those of No. 3 shown in Table 1, and had suitable characteristics as a substrate material for mounting semi-conductor elements.

EXAMPLE 13

Figure 2:
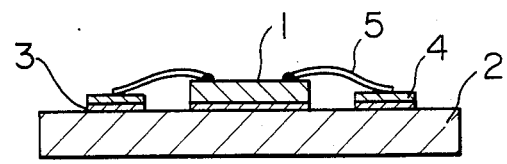
FIG. 2 is a cross-sectional view of a semi-conductor power module built up by using the present ceramics as a substrate.

A semi-conductor device having a cross-sectional structure shown in FIG. 2 was prepared, using the sintered body of No. 3 shown in Table 1 among the sintered bodies prepared according to the present invention. For comparison, a semi-conductor device shown in FIG. 3 was prepared according to the prior art, and these devices were subjected to heat cycle tests between −55° C. and 150° C. The prior art semi-conductor device had such troubles at the 10th cycle as peeling off solderings, and crack development on the substrate, whereas the semi-conductor device using the present sintered body as a substrate had no abnormal state even after 10,000 cycles.

EXAMPLE 14

To investigate the mechanical properties of sintered bodies of SiC-AlN system according to the present invention, bending strength and fracture toughness of the sintered bodies were measured. For comparison, the bending strength and fracture toughness of SiC were also measured.

Table 16 shows the bending strength and fracture toughness of these materials. It is obvious from Table 16 that the bending strength of the present materials is by about one-half lower than that of SiC sintered body shown in Comparative Example 1, but the fracture toughness of the present materials is about 1.5 times as high as that of the SiC sintered body. Thus, the present sintered bodies of SiC-AlN system have a larger resistance against fracture when used as a structural material than the SiC sintered body and thus are more advantageous over the SiC sintered body.

TABLE 16

| No. | Bending strength MPa | Fracture toughness $MN/m^{3/2}$ |
|---|---|---|
| 3 | 480 | 6.0 |
| 4 | 450 | 6.3 |
| 5 | 440 | 6.4 |
| 73 | 800 | 4.1 |

EXAMPLE 15

The sintered bodies of SiC-AlN system according to the present invention have such a structure that SiC grains are dispersed in the AlN matrix. SiC is a very hard material, as compared with AlN. In the present sintered bodies of SiC-AlN system, the hard SiC crystal grains exist as dispersed therein, and thus the sintered bodies have a good processability. That is, the present sintered bodies have a low processing resistance by about one-half when processed by a diamond grinding stone than that of SiC sintered body or AlN sintered body. In the case of continuous processing by the grinding stone for a lone time, it is necessary to dress the grinding stone occasionally, but in the case of processing the present sintered bodies of SiC-AlN system, the interval of dressing can be made by about three times larger than in the case of processing the SiC sintered body or AlN sintered body, because the SiC crystal grains are dispersed in te AlN matrix of the present sintered bodies, and the SiC crystal grains are considerably harder than AlN, so that the dispersed SiC crystal grains play a role of dressing the diamond grinding stone.

Comparative Example 1

49.0 g of the same SiC powder as in Example 1 and 1.0 g of the same AlN powder as in Example 1 were weighed out as starting materials, and green bodies were prepared therefrom in the same manner as in Example 1 and sintered by hot press in the same manner as in Example 1 or by changing the hot press temperature in the same manner as in Example 3.

Table 17 shows characteristics of the thus obtained sintered bodies. It is obvious from Table 17 that the sintered bodies are not densified unless the hot press temperature is more than 1,850° C., and only the densified sintered bodies having low thermal conductivity and electrical resistivity are obtained owing to the higher hot press temperature.

TABLE 17

| No. | Temperature °C. | Density $g/cm^3$ | Thermal conductivity $W/m \cdot °K.$ | Electrical resistivity $\Omega \cdot cm$ |
|---|---|---|---|---|
| 70 | 1900 | 2.44 | 20 | $4 \times 10^4$ |
| 72 | 1950 | 3.15 | 50 | $3 \times 10^1$ |
| 73 | 2050 | 3.21 | 60 | $2 \times 10^1$ |

COMPARATIVE EXAMPLE 2

The same AlN powder as in Example 1 was admixed with 55 by weight of $CaF_2$ powder having an average particle size of 1.0 μm and a purity of 99.9% as a sintering additive, and a green body was prepared therefrom and sintered by hot press in the same manner as in Example 1.

The thus obtained AlN sintered body free of SiC was densified to a density of 3.25 $g/cm^3$, but had a thermal conductivity at 20° C. of 183 W/m.°K. and an electrical resistivity at 20° C. of $3 \times 10^{14}$ $\Omega$.cm.

EXAMPLE 16

Figure 3:
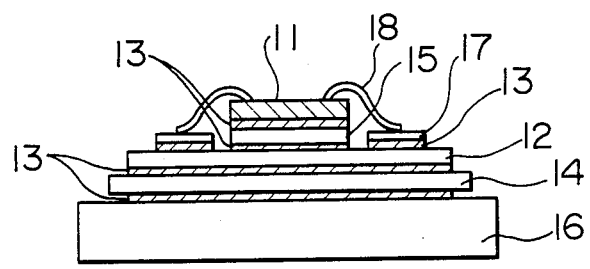
FIG. 3 is a cross-sectional view of a semi-conductor power module built up by using an alumina substrate according to the prior art.

A semi-conductor power module will be described as a specific application of the present sintered body as an electrical insulating substrate. FIG. 2 is a cross-sectional view of a semi-conductor powder module using the present sintered body as a substrate, and FIG. 3 is a cross-sectional view of a semi-conductor powder module according to the prior art.

In the case of using the present sintered body as a substrate, a semi-conductor element 1 can be directly bonded to a substrate through a solder 3, and thus the device can be considerably simplified, and also the heat resistance can be considerably lowered at the same time. On the other hand, in the semi-conductor powder module according to the prior art, a semi-conductor element 11 is bonded to an $Al_2O_3$ substrate 14 through a molybdenum spacer 15 capable of relieving the strain due to a difference in the thermal expansion between the $Al_2O_3$ substrate 14 and the semi-conductor element 1 by a solder 13, and the substrate 14 is fixed to a support plate 16. Owing to poor heat radiation of $Al_2O_3$, a heat sink 12 is provided between the spacer 15 and the substrate 14 to improve the heat radiation. However, owing to the use of Al₂O₃ having a low thermal conductivity, the heat radiation is inferior to that of the module using the present sintered body as a substrate shown in FIG. 2. Furthermore, the structure to be built up is complicated, as shown in FIG. 3, and owing to use of materials having considerably different coefficients of thermal expansion, the prior art module has a shorter life when repeated thermal stresses are applied thereto.

EXAMPLE 17

Figure 4:
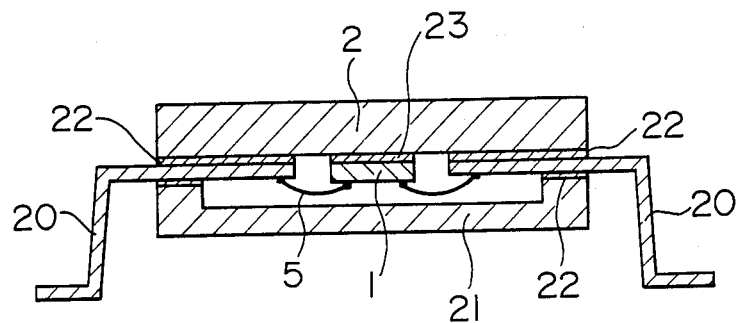
FIGS. 4 and 5 are cross-sectional views of semi-conductor packages built up by using the present ceramics as a substrate.
Figure 5:
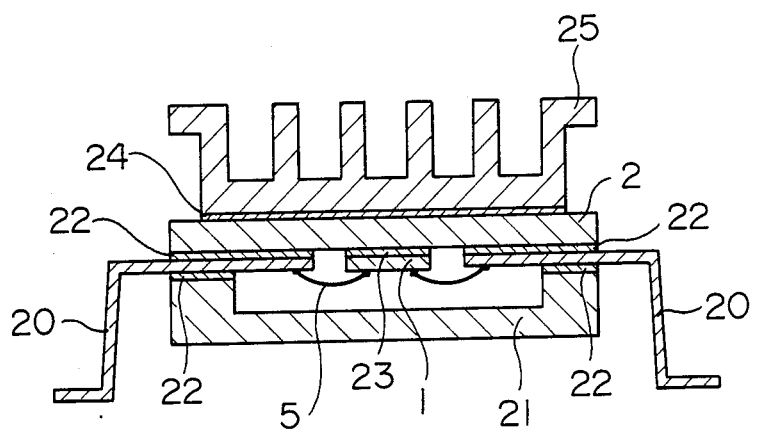

FIGS. 4 and 5 are cross-sectional views of semi-conductor packages, as built up by using the present sintered body as a ceramics substrate for mounting a semi-conductor element.

In this Example, a polished sintered body obtained in Example 1 is used as a substrate 2, and a semi-conductor element 1 is bonded to the substrate 2 at the center by a gold paste 23. The gold paste 23 is formed on the substrate 2 by screen printing, and the semi-conductor element 1 is placed thereon, and bonded thereto at a predetermined temperature under a load. Then, a lead frames 20 are placed on the seal glass formed on the substrate 2 at desired locations by glazing in advancing, and bonded to the substrate 2 by heating. For the lead frame 20, Cu, Fe-Ni alloy, etc. can be used. Then, the semi-conductor element 1 is electrically connected to the lead frames 20 by thin metallic wires 5. To make the connection to the semi-conductor element 1, the tip ends of the thin metallic wires 5 are heated and melted by a electric discharge means, etc. to form balls on the semi-conductor element 1, and the balls are pressed by ultrasonic vibration through capillaries, etc. and subjected to solid phase bonding to the semi-conductor element 1 by the heat of friction, whereas on the lead frame side the thin metallic wires 5 are subjected to a solid phase bonding to the lead frames 20 by giving the similar ultrasonic vibration to the sides of the wires 5 without forming the balls. For the thin metallic wires 5, wires of gold, aluminum, copper, etc., 10 to 100 μm, preferably 20 to 50 μm, in diameter can be used. Particularly, a soft annealed copper wire is preferably used. It is preferable to form the balls in a soft state.

Finally, a cap 21 is likewise bonded to the substrate 2 by the seal glass 22. By sealing with the cap 21, a He gas, etc. under a little higher pressure than the atmospheric pressure is used.

FIG. 5 shows the semi-conductor package of FIG. 4, provided with a heat radiation fin 25. For the heat radiation fin 25, aluminum, ceramics having a high thermal conductivity, etc. are used. As the ceramics, the present sintered body can be used. The heat radiation fin 25 is bonded to the substrate 2 by resin 22, etc. The heat radiation fin 25 can be cooled with air.

In this Example, a semi-conductor package having a good heat radiation and a long life against the repeated heat cycles can be obtained.

According to the present invention, a sintered body of SiC-AlN system having a high thermal conductivity and a good electrical insulation can be effective obtained.

What is claimed is:

1. A highly thermal conductive, electrical insulating aluminum nitride sintered body having at least 90% of theoretical density, which comprises 20 to 40% by weight of silicon carbide, the balance being substantially aluminum nitride, the silicon carbide containing not more than 0.1% by weight of sum total of boron, aluminum and nitrogen, and not more than 0.2% by weight of sum total of iron, titanium, vanadium, chromium and nickel, and the aluminum nitride containing not more than 1% by weight of oxygen and not more than 0.5% by weight of sum total of silicon, iron and magnesium.

2. A highly thermal conductive, electrical insulating aluminum nitride sintered body according to claim 1, which has a thermal conductivity at 20° C. of at least 250 W/m°.°K., an electrical resistivity at 20° C. of at least $10^{10}$ Ω.cm and a dielectric strength at 20° C. of at least 10 kV/cm.

3. A highly thermal conductive, electrical insulating aluminum nitride sintered body having at least 90% of theoretical density, which comprises 20 to 40% by weight of silicon carbide, the balance being essentially aluminum nitride, the silicon carbide containing not more than 0.03% by weight of sum total of boron, aluminum, nitrogen and not more than 0.03% by weight of sum total of iron, vanadium, chromium and nickel, and not more than 0.2% by weight of titanium, and the aluminum nitride containing not more than 0.3% by weight of oxygen and not more than 0.5% by weight of sum total of silicon, iron and magnesium.

4. A process for preparing a highly thermal conductive, electrical insulating aluminum nitride sintered body, which comprises mixing 20 to 40% by weight of α-type or β-type SiC powder having an average particle size of not more than 20 μm and containing not more than 0.1% by weight of sum total of boron, aluminum and nitrogen and not more than 0.2% by weight of sum total of iron, titanium, vanadium, chromium and nickel with 80 to 60% by weight of AlN powder having an average particle size of not more than 10 μm and containing not more than 1% by weight of oxygen and not more than 0.5% by weight of sum total of silicon, iron and magnesium, molding the resulting powder mixture into a green body, and sintering the green body at a temperature of 1,750° to 1,900° C. in a non-oxidative atmosphere for a time long enough to make at least 90% of theoretical density.

5. A process according to claim 4, wherein the sintered body has a thermal conductivity at 20° of at least 250 W/m.°K., an electrical resistivity at 20° C. of at least $10^{10}$ Ω.cm, and a dielectric strength at 20° C. of at least 10 kV/cm.

6. A process for preparing a highly thermal conductive, electrical insulating aluminum nitride sintered body, which comprises mixing 20 to 40% by weight of α-type or β-type SiC powder having an average particle size of not more than 20 μm and containing not more than 0.03% of sum total of boron, aluminum and nitrogen, not more than 0.03% by weight of sum total of iron, vanadium, chromium and nickel and not more than 0.2% by weight of titanium with 80 to 60% by weight of AlN powder having an average particle size of not more than 10 μm and containing not more than 0.3% by oxygen and 0.2% by weight of sum total of silicon, iron and magnesium, molding the resulting powder mixture into a green body, and then sintering the green body at a temperature of 1,750° to 1,900° C. in a non-oxidative atmosphere for a time long enough to make at least 90% of theoretical density.

7. A powder composition for a highly thermal conductive, electrical insulating aluminum nitride sintered body, which comprises a powder mixture of 20 to 40% by weight of α-type or β-type SiC powder having an average particle size of not more than 20 μm and containing not more than 0.1% by weight of sum total of boron, aluminum and nitrogen and not more than 0.2% by weight of sum total of iron, titanium, vanadium, chromium and nickel with 80 to 40% by weight of AlN powder having an average particle size of not more than 10 μm and containing not more than 1% by weight of oxygen and not more than 0.5% by weight of sum total of silicon, iron and magnesium.

8. A powdery composition for a highly thermal conductive, electrical insulating aluminum nitride sintered body, which comprises a powder mixture of 20 to 40% by weight of α-type or μ-type SiC powder having an average particle size of not more than 20 μm and containing not more than 0.03% by weight of sum total of boron, aluminum and nitrogen, not more than 0.03% by weight of sum total of iron, vanadium, chromium and nickel and at least 0.2% by weight of titanium with 80 to 40% by weight of AlN having an average particle size of not more than 10 μm and containing not more than 0.3% by weight of iron and 0.2% by weight of sum total of silicon, iron, and magnesium.

9. A semi-conductor device which comprises a ceramics substrate and a semi-conductor element mounted thereon, the ceramics substrate being composed of a highly thermal conductive, electrical insulating aluminum nitride sintered body having at least 90% of theoretical density and comprising 20 to 40% by weight of silicon carbide, the balance being essentially aluminum nitride, the silicon carbide containing not more than 0.1% by weight of sum total of boron, aluminum and nitrogen and not more than 0.2% by weight of sum total or iron, titanium, vanadium, chromium and nickel, and the aluminum nitride containing not more than 1% by weight of oxygen and not more than 0.5% by weight of sum total of silicon, iron and magnesium.

10. A semi-conductor device according to claim 9, wherein the sintered body has a thermal conductivity at 20° C. of at least 250 W/m.°K., an electrical resistivity at 20° C. of at least $10^{10}$ Ω.cm and a dielectric strength at 20° C. of at least 10 kV/cm.

11. A semi-conductor device which comprises a ceramics substrate and a semi-conductor element bonded to the ceramics substrate by soldering, the ceramics substrate being composed of a highly thermal conductive, electrical insulating aluminum nitride sintered body having at least 90% of theoretical density and comprising 20 to 40% by weight of silicon carbide, the balance being substantially aluminum nitride, the silicon carbide containing not more than 0.03% by weight of sum total of boron, aluminum and nitrogen, not more than 0.03% by weight of sum total of iron, vanadium, chromium and nickel and not more than 0.2% by titanium, and the aluminum nitride containing not more than 0.3% by weight of oxygen and not more than 0.2% by weight of sum total of silicon, iron and magnesium.

* * * * *